United States Patent
Ge et al.

(10) Patent No.: US 10,476,634 B2
(45) Date of Patent: Nov. 12, 2019

(54) SYSTEM AND METHOD FOR POLAR ENCODING AND DECODING

(71) Applicants: Yiqun Ge, Kanata (CA); Wuxian Shi, Kanata (CA)

(72) Inventors: Yiqun Ge, Kanata (CA); Wuxian Shi, Kanata (CA)

(73) Assignee: HUAWEI TECHNOLOGIES CO., LTD., Shenzhen (CN)

(*) Notice: Subject to any disclaimer, the term of this patent is extended or adjusted under 35 U.S.C. 154(b) by 0 days.

(21) Appl. No.: 15/061,348

(22) Filed: Mar. 4, 2016

(65) Prior Publication Data
US 2017/0257186 A1    Sep. 7, 2017

(51) Int. Cl.
| | |
|---|---|
| *G06F 11/10* | (2006.01) |
| *H04L 1/00* | (2006.01) |
| *H03M 13/09* | (2006.01) |
| *H03M 13/15* | (2006.01) |
| *H03M 13/13* | (2006.01) |

(52) U.S. Cl.
CPC ........ *H04L 1/0057* (2013.01); *H03M 13/096* (2013.01); *H03M 13/13* (2013.01); *H03M 13/151* (2013.01); *H04L 1/0041* (2013.01); *H04L 1/0061* (2013.01)

(58) Field of Classification Search
CPC ....... G06F 11/10; H03M 13/05; H03M 13/09; H03M 13/096; H03M 13/1111; H03M 13/13; H03M 13/151; H03M 13/29; H04L 1/00; H04L 1/0057; H04L 1/0061
See application file for complete search history.

(56) References Cited

U.S. PATENT DOCUMENTS

| | | | |
|---|---|---|---|
| 5,508,909 A | | 4/1996 | Maxwell et al. |
| 5,990,810 A | * | 11/1999 | Williams .............. G06F 3/0608 341/51 |

(Continued)

FOREIGN PATENT DOCUMENTS

| | | |
|---|---|---|
| CN | 104219019 A | 12/2014 |
| WO | 2014190915 A1 | 12/2014 |
| WO | 2015026148 A1 | 2/2015 |

OTHER PUBLICATIONS

Lecture 9:Polar Codes, Nov. 29, 2013 retrieved at https://www.rocq.inria.fr/secret/Jean-Pierre.Tillichi/enseignement/X2015/cours9eng.pdf.

(Continued)

*Primary Examiner* — Albert Decady
*Assistant Examiner* — Enamul M Kabir

(57) ABSTRACT

Systems and methods for Polar encoding with a blockwise checksum are provided. The method involves processing a set of K information blocks to produce a blockwise checksum with u blocks, where K>=2, and u>=1, and where each information block or checksum block contains P bits. The blockwise checksum may, for example, be a Fletcher checksum. The Polar code may be based on an m-fold Kronecker product matrix. Then, an N-bit input vector is produced with P×K information bits and the P×u blockwise checksum bits, and with N−PK−Pu frozen bits, where N=2$^m$ where m>=2. The N-bit input vector is processed to produce a result equivalent to multiplying the input vector by a Polar code generator matrix to produce a codeword. The codeword is then transmitted or stored.

20 Claims, 7 Drawing Sheets

$$G_2 = \begin{bmatrix} 1 & 0 \\ 1 & 1 \end{bmatrix} \quad G_2^{\otimes 2} = \begin{bmatrix} G_2 & 0 \\ G_2 & G_2 \end{bmatrix} \quad G_2^{\otimes 3} = \begin{bmatrix} G_2 & 0 & 0 & 0 \\ G_2 & G_2 & 0 & 0 \\ G_2 & 0 & G_2 & 0 \\ G_2 & G_2 & G_2 & G_2 \end{bmatrix}$$

$$G_2^{\otimes 2} = \begin{bmatrix} 1 & 0 & 0 & 0 \\ 1 & 1 & 0 & 0 \\ 1 & 0 & 1 & 0 \\ 1 & 1 & 1 & 1 \end{bmatrix} \quad G_2^{\otimes 3} = \begin{bmatrix} 1 & 0 & 0 & 0 & 0 & 0 & 0 & 0 \\ 1 & 1 & 0 & 0 & 0 & 0 & 0 & 0 \\ 1 & 0 & 1 & 0 & 0 & 0 & 0 & 0 \\ 1 & 1 & 1 & 1 & 0 & 0 & 0 & 0 \\ 1 & 0 & 0 & 0 & 1 & 0 & 0 & 0 \\ 1 & 1 & 0 & 0 & 1 & 1 & 0 & 0 \\ 1 & 0 & 1 & 0 & 1 & 0 & 1 & 0 \\ 1 & 1 & 1 & 1 & 1 & 1 & 1 & 1 \end{bmatrix}$$

(56) References Cited

U.S. PATENT DOCUMENTS

| | | | | |
|---|---|---|---|---|
| 8,347,186 | B1* | 1/2013 | Arikan | H03M 13/13 714/774 |
| 2014/0173376 | A1 | 6/2014 | Jeong et al. | |
| 2015/0077277 | A1* | 3/2015 | Alhussien | H03M 13/618 341/67 |
| 2015/0092886 | A1* | 4/2015 | Ionita | H04L 25/4917 375/298 |
| 2015/0293716 | A1* | 10/2015 | Jiang | H03M 13/13 711/154 |
| 2015/0295593 | A1* | 10/2015 | Trifonov | H03M 13/3746 714/776 |
| 2016/0013887 | A1* | 1/2016 | Shen | H04L 1/0041 375/295 |
| 2016/0079999 | A1* | 3/2016 | Shen | H03M 13/09 714/758 |
| 2016/0182187 | A1 | 6/2016 | Kim et al. | |
| 2017/0047947 | A1* | 2/2017 | Hong | H03M 13/2906 |

OTHER PUBLICATIONS

Erdal Arikan, "Channel Polarization: A Method for Constructing Capacity-Achieving Codes for Symmetric Binary-Input Memoryless Channels" IEEE Transactions on Information Theory 55 (7): 3051 73. arXiv:0807.3917v5. Jul. 20, 2016.

Ido Tal, et al "List Decoding Polar Codes", Universtiy of California San Diego, arXiv:1206.0050v1 [cs.IT] May 31, 2012.

J. Fletcher,"An Arithmetic Checksum for Serial Transmissions",IEEE Transactions on Communications ( vol. 30 , Issue: 1 , Jan. 1982 ),pp. 247-252.

Craig Partridge et al.,"Performance of Checksums and CRCs over Real Data",Computer Communication Review, ACM, New York, NY, US, vol. 25,No. 4,total 11 pages.

* cited by examiner $$G_2 = \begin{bmatrix} 1 & 0 \\ 1 & 1 \end{bmatrix} \quad G_2^{\otimes 2} = \begin{bmatrix} G_2 & 0 \\ G_2 & G_2 \end{bmatrix} \quad G_2^{\otimes 2} = \begin{bmatrix} G_2 & 0 & 0 & 0 \\ G_2 & G_2 & 0 & 0 \\ G_2 & 0 & G_2 & 0 \\ G_2 & G_2 & G_2 & G_2 \end{bmatrix}$$

$$G_2^{\otimes 2} = \begin{bmatrix} 1 & 0 & 0 & 0 \\ 1 & 1 & 0 & 0 \\ 1 & 0 & 1 & 0 \\ 1 & 1 & 1 & 1 \end{bmatrix}$$

$$G_2^{\otimes 3} = \begin{bmatrix} 1 & 0 & 0 & 0 & 0 & 0 & 0 & 0 \\ 1 & 1 & 0 & 0 & 0 & 0 & 0 & 0 \\ 1 & 0 & 1 & 0 & 0 & 0 & 0 & 0 \\ 1 & 1 & 1 & 1 & 0 & 0 & 0 & 0 \\ 1 & 0 & 0 & 0 & 1 & 0 & 0 & 0 \\ 1 & 1 & 0 & 0 & 1 & 1 & 0 & 0 \\ 1 & 0 & 1 & 0 & 1 & 0 & 1 & 0 \\ 1 & 1 & 1 & 1 & 1 & 1 & 1 & 1 \end{bmatrix}$$

FIG. 1

SYSTEM AND METHOD FOR POLAR ENCODING AND DECODING

FIELD

The invention relates to Polar codes, and to encoders and decoders for Polar codes.

BACKGROUND

Polar codes are based on Kronecker product matrices. $G = F^{\otimes m} = \otimes \ldots \otimes F$ is the m-fold Kronecker product of a seed matrix F.

SUMMARY

According to one aspect of the present invention, there is provided a method comprising: processing a set of K information blocks to produce a blockwise checksum with u blocks, where K>=2, and u>=1, and where each information block or checksum block contains P bits; producing an N-bit input vector with P×K information bits and the P×u blockwise checksum bits, and with N−PK−Pu frozen bits, where $N = 2^m$ where m>=2; processing the N-bit input vector to produce a result equivalent to multiplying the input vector by a Polar code generator matrix to produce a codeword; transmitting or storing the codeword.

According to another aspect of the present invention, there is provided a method comprising: receiving a word based on a codeword transmitted to the receiver that encodes information blocks and blockwise checksum blocks with a polar encoder; performing decoding of the received word to determine estimated values for the information blocks and the blockwise checksum blocks; calculating blockwise checksum bytes based on the estimated values for the information bytes; comparing the calculated blockwise checksum bytes with the estimated values for the block-wise checksum bytes and if there is a match determining the information bytes have been decoded correctly.

According to still another aspect of the present invention, there is provided an apparatus comprising: a blockwise checksum calculator to process a set of K information blocks to produce a blockwise checksum with u blocks, where K>=2, and u>=1, and where each information block or checksum block contains P bits; a polar encoder to produce an N-bit input vector with P×K information bits and the P×u blockwise checksum bits, and with N−(P×K)−(P×u) frozen bits, where $N = 2^m$ where m>=2, and to processing the N-bit input vector to produce a result equivalent to multiplying the input vector by a Polar code generator matrix to produce a codeword; a transmitting device to transmit the codeword.

According to yet another aspect of the present invention, there is provided an apparatus comprising: a receiving device to receive a word based on a transmitted codeword that encodes information blocks and a blockwise checksum blocks with a polar encoder; a polar decoder to decode the received word to determine estimated values for the information blocks and the blockwise checksum blocks; a blockwise checksum calculator to calculate blockwise checksum bytes based on the estimated values for the information bytes, and compare the calculated blockwise checksum bytes with the estimated values for the blockwise checksum bytes and if there is a match determine the information bytes have been decoded correctly.

In some embodiments, for one or more of the aspects described above, the blockwise checksum is a Fletcher checksum.

In some embodiments, for one or more of the aspects described above, calculating checksum bytes comprises calculating two checksum bytes.

In some embodiments, for one or more of the aspects described above, the generator matrix is an m-fold Kronecker product matrix $G_2^{\otimes m}$ where $$G_2 = \begin{bmatrix} 1 & 0 \\ 1 & 1 \end{bmatrix}.$$

In some embodiments, for one or more of the aspects described above, the blockwise checksum bits are inserted in relatively reliable positions for the Polar code generator matrix, as defined by a reliability criterion.

BRIEF DESCRIPTION OF THE DRAWINGS

Embodiments of the invention will be described in greater detail with reference to the accompanying drawings, in which:

FIG. 1 is a diagram showing how a Kronecker product matrix can be produced from a seed matrix;

DETAILED DESCRIPTION

Figure 2:
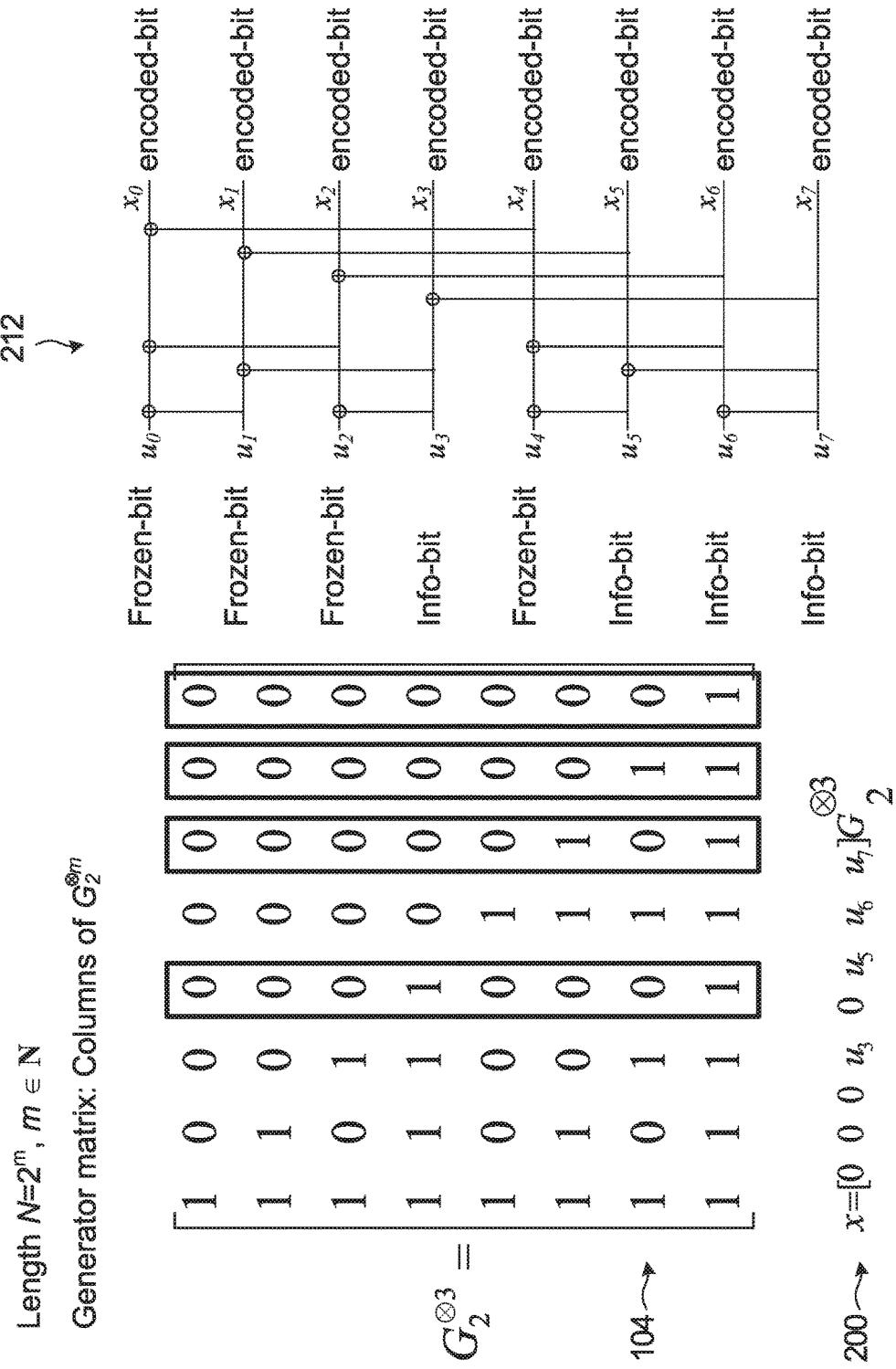
FIG. 2 is a diagram showing an example use of a Polar code generator matrix for producing codewords and a schematic illustration of an example Polar encoder.

In "Channel Polarization: A Method for Constructing Capacity-Achieving Codes for Symmetric Binary-Input Memoryless Channels" by E. Arikan, *IEEE Transactions on Information Theory*, vol. 55, no. 7 (July 2009) [Arikan], a theory relating to "channel polarization" of Polar codes was proved in section IV. Channel polarization is an operation which produces N "synthetic" channels from N independent copies of a binary-input discrete memoryless channel (B-DMC) such that, with increasing values of N, the new synthetic channels are polarized in the sense that their mutual information is either close to 0 (completely noisy channels) or close to 1 (perfectly noiseless channels). In other words, some bit positions of an input vector provided to an encoder will experience a completely noisy channel, i.e., have a relatively low reliability/low possibility to be correctly decoded when considered independently of other synthetic channels. Some bit positions of an input vector provided to an encoder will experience a very clean channel, i.e., have high possibility/high reliability to be correctly decoded when considered independently of other synthetic channels. In some cases, the reliability of a synthetic channel when considered independently of other synthetic channels may be referred to as the "capacity" of the synthetic channel.

An example of channel polarization can be provided that is based on a Kronecker product.

If A is an m×n matrix and B is a p×q matrix, then the Kronecker product A⊗B is the mp×nq block matrix:

$$A \otimes B = \begin{bmatrix} a_{11}B & \cdots & a_{1n}B \\ \vdots & \ddots & \vdots \\ a_{m1}B & \cdots & a_{mn}B \end{bmatrix},$$

more explicitly:

$$A \otimes B = \begin{bmatrix} a_{11}b_{11} & a_{11}b_{12} & \cdots & a_{11}b_{1q} & \cdots & \cdots & a_{1n}b_{11} & a_{1n}b_{12} & \cdots & a_{1n}b_{1q} \\ a_{11}b_{21} & a_{11}b_{22} & \cdots & a_{11}b_{2q} & \cdots & \cdots & a_{1n}b_{21} & a_{1n}b_{22} & \cdots & a_{1n}b_{2q} \\ \vdots & \vdots & \ddots & \vdots & & & \vdots & \vdots & \ddots & \vdots \\ a_{11}b_{p1} & a_{11}b_{p2} & \cdots & a_{11}b_{pq} & \cdots & \cdots & a_{1n}b_{p1} & a_{1n}b_{p2} & \cdots & a_{1n}b_{pq} \\ \vdots & \vdots & & \vdots & \ddots & & \vdots & \vdots & & \vdots \\ \vdots & \vdots & & \vdots & & \ddots & \vdots & \vdots & & \vdots \\ a_{m1}b_{11} & a_{m1}b_{12} & \cdots & a_{m1}b_{1q} & \cdots & \cdots & a_{mn}b_{11} & a_{mn}b_{12} & \cdots & a_{mn}b_{1q} \\ a_{m1}b_{21} & a_{m1}b_{22} & \cdots & a_{m1}b_{2q} & \cdots & \cdots & a_{mn}b_{21} & a_{mn}b_{22} & \cdots & a_{mn}b_{2q} \\ \vdots & \vdots & \ddots & \vdots & & & \vdots & \vdots & \ddots & \vdots \\ a_{m1}b_{p1} & a_{m1}b_{p2} & \cdots & a_{m1}b_{pq} & \cdots & \cdots & a_{mn}b_{p1} & a_{mn}b_{p2} & \cdots & a_{mn}b_{pq} \end{bmatrix}.$$

FIG. 1 shows how a Kronecker product matrix can be produced from a seed matrix $G_2$ 102. Shown in FIG. 1 are the 2-fold Kronecker product matrix $G_2^{\otimes^2}$ 102 and the 3-fold Kronecker product matrix $G_2^{\otimes^3}$ 104. This approach can be continued to produce m-fold Kronecker product matrix $G_2^{\otimes^m}$.

A polar code can be formed from a Kronecker product matrix based on matrix $G_2$. For a polar code having codewords of length $N=2^m$, the generator matrix is $G_2^{\otimes^m}$. An example using Kronecker product matrix $G_2^{\otimes^3}$ to produce codewords of length 8 is depicted in FIG. 2. A codeword x is formed by the product of an input vector u and the Kronecker product matrix $G_2^{\otimes^3}$ 104 as indicated at 200. The input vector u is composed of frozen bits and information bits. In the specific example, N=8, so the input vector u is an 8 bit vector, and the codeword x is an 8-bit vector. The input vector has frozen bits in positions 0, 1, 2 and 4, and has information bits at positions 3, 5, 6 and 7. An example implementation of a coder that generates codewords is indicated at 212, where the frozen bits are all set to 0, where circle plus is modulo 2 addition. For the example of FIG. 2, an N=8 bit input vector is formed from K=4 information bits and N−K=4 frozen bits. Codes of this form are referred to as Polar codes and the encoder is referred to as a Polar encoder. Decoders for decoding Polar codes are referred to as Polar decoders.

A specific example of a Polar code was described above in which the code is based on the m-fold Kronecker product of a specific matrix $G_2$. The use of this generator matrix results in channel polarization. More generally, any generator matrix that produces a channel polarization effect will be referred to herein as a Polar code generator matrix.

In Polar code construction, ideally the information bits are put in the more "reliable" positions of an input vector, and frozen bits (i.e. bits already known to both encoder and decoder) are put in the more "unreliable" positions of the input vector. However, when information is transmitted over a physical channel, the reliability of a given bit position is also a function of the characteristics of the physical channel, such as the erasure rate of the physical channel. In theory, the frozen bits can be set to any value so long as the frozen bits sequence is known to both the encoder and the decoder. In conventional applications, the frozen bits are all set to zero.

Figure 3:
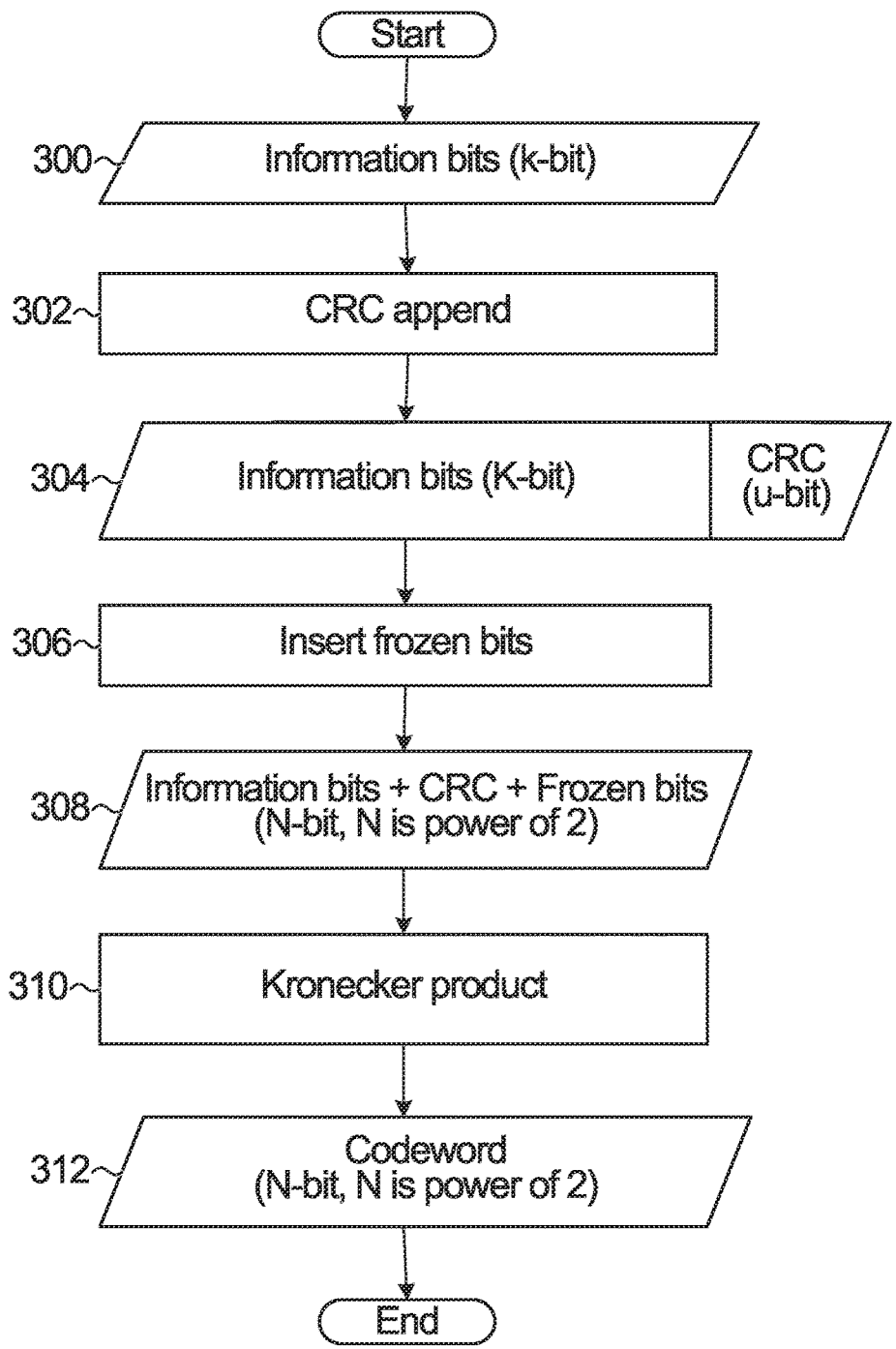
FIG. 3 is a flow diagram of a method for encoding information using a Polar code.

Cyclic redundancy check (CRC) bits can be included in the input vector to assist in decoding. CRC bits are generated based on the information bits being transmitted. CRC bits are included in reliable positions (i.e. the positions with a reliable channel). CRC bits may be added to improve polar code performance for short to moderate block length. For a very long block length polar encoder, CRC may not be needed, although it may still be employed. This is because the reliability increases with the size of the block length. Reliability becomes very strong for a very long codeword. In a case where CRC bits are included, an N-bit input vector is formed from K information bits, a u-bit CRC, and N−K−u frozen bits. An example is depicted in FIG. 3. Starting with a k-bit information block 300, a u-bit CRC is appended at 302 to produce a vector with the K-bit information block, and the u-bit CRC at 304. At 306, the N−K−u frozen bits are inserted to produce the N-bit input vector with the K-bit information block, and the u-bit CRC and the N−K−u frozen bits, where N is a power of 2. The vector 308 is then multiplied by the Kronecker product matrix at 310 to produce an N-bit codeword 312.

Figure 4:
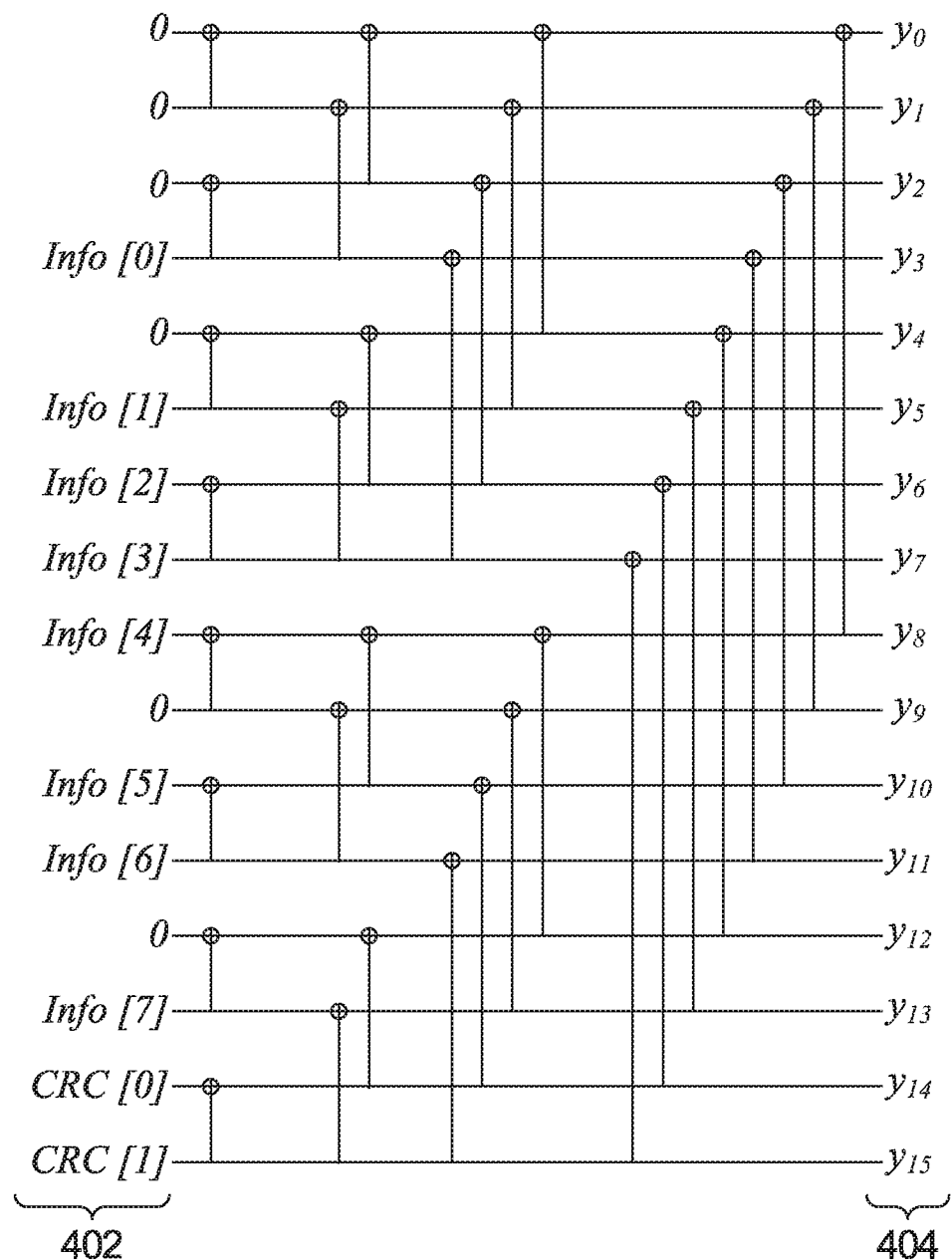
FIG. 4 is a schematic illustration of an example Polar encoder.

An example implementation of a Polar encoder including CRC bits is depicted in schematic form in FIG. 4, where the circle plus symbol represents modulo 2 addition. The encoder produces a codeword 404 from an input vector 402. In the example shown, N=16, K=8, u=2, and there are six frozen bits for a code rate of 0.5. The frozen bits, which are illustrated as having been set to zero, are inserted at positions 0, 1, 2, 4, 9, and 12 of the input vector 402. Information bits, denoted as Info[0] through Info[7], are provided at positions 3, 5, 6, 7, 8, 10, 11, and 13, respectively, of the input vector 402. Two CRC bits, denoted as CRC[0] and CRC[1], are provided at positions 14 and 15, respectively, of the input vector 402. The input vector used by an encoder to produce a codeword is sometimes referred to as a message. A codeword may be transmitted over a channel, and a receiver may, in turn, receive a received word. Due to channel effects mostly noise, the received word are subjected to noise. A decoder attempts to decode the received word to determine information bits in the originally transmitted message.

During decoding of a codeword encoded from an input vector, the locations and values of frozen bits in the input vector are treated as known. For descriptive simplicity, bits of the input vector that are not known to the decoder in advance will be referred to as "unknown" bits. For example, the information bits and the CRC bits are unknown bits. A characteristic of conventional Polar decoder is that the unknown bits are decoded sequentially, or the Polar decoding algorithm is based on the successive cancellation. Once a particular decision has been made regarding how an unknown bit is to be decoded, that bit never has chance to be changed or corrected, and the decoder moves on to decoding the next unknown bit. In other words, there is "no going back". A bit that was set at step i cannot be changed at step j>i. In addition, knowledge of the value of subsequent frozen bits is not taken into account, i.e., subsequent frozen bits, even though known to the decoder, will not help decode the current unknown bit.

An embodiment of the invention provides a Polar encoder and decoder that employs a Fletcher checksum. A first step in computing a Fletcher checksum involves dividing a binary data word to be protected from errors into short "blocks" of bits and computing the modular sum of those blocks. As an example, the data may be a message to be transmitted consisting of 136 characters, each stored as an 8-bit byte, making a data word of 1088 bits in total. A convenient block size would be 8 bits, although this is not required. Similarly, a convenient modulus would be 255, although, again, others could be chosen.

To perform the first step in computing the Fletcher checksum in this example, a first checksum value which is a simple checksum is computed by determining the modular sum of all the 8-bit bytes of the message, (e.g. by dividing by 255 and keeping only the remainder). In practice, the modulo operation is performed during the summation to control the size of the result. A second step in computing the Fletcher checksum involves computing a second checksum value. The second checksum is the modular sum of the values produced while calculating the first simple checksum as each block of the data word is added to it. The modulus used is the same. So, for each block of the data word, taken in sequence, the block's value is added to the first checksum and the new value of the first checksum is then added to the second checksum. Both sums start with the value zero (or some other known value). At the end of the data word, the modulus operator is applied.

The first checksum value and the second checksum value are then combined to form the Fletcher checksum value. In some embodiments, this is done by concatenating the two checksum values. This produces a 2-byte checksum in for the described example. In other embodiments, a modular sum of the two values is computed. This produces a 1-byte checksum for the described example. The receiver of the message can re-compute the checksum and compare it to the value received to determine whether the message has been altered by the transmission process.

Figure 5:
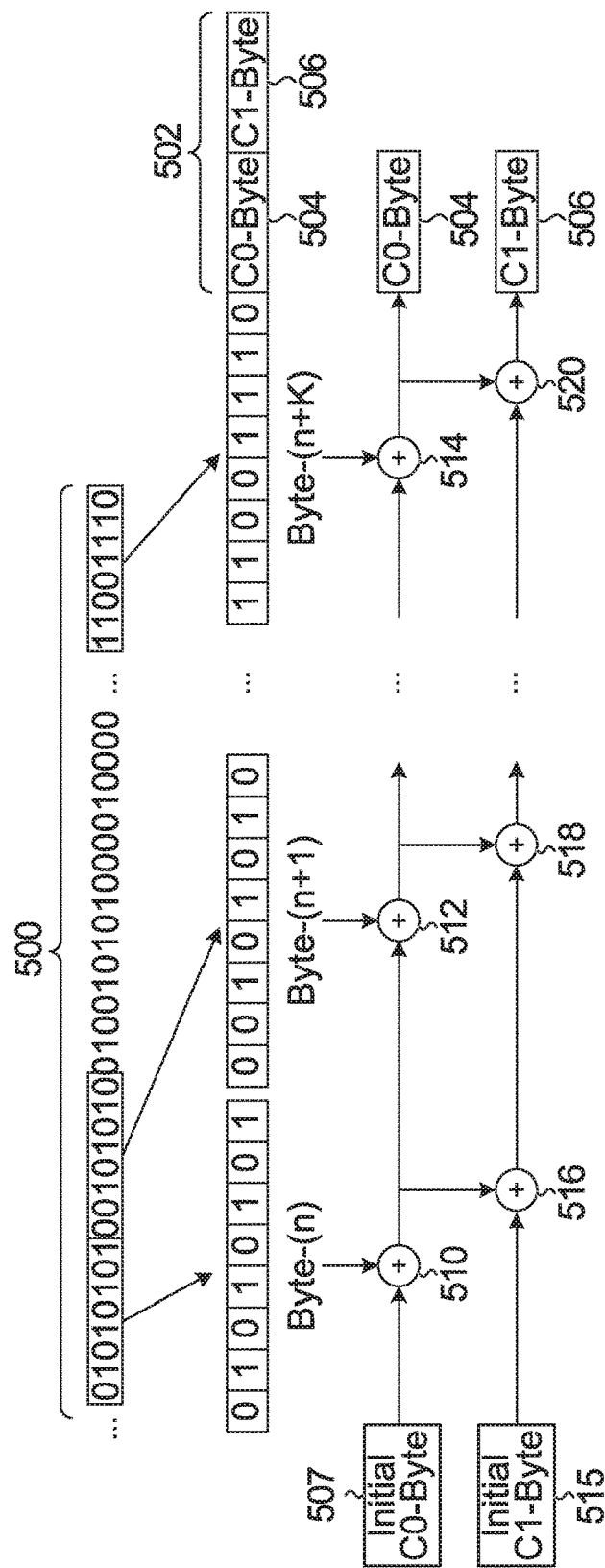
FIG. 5 is a schematic diagram of a Fletcher Checksum calculator.

Referring to FIG. 5, starting with a K-byte information word 500, a 2-byte Fletcher checksum 502 is computed and appended (or otherwise inserted) to produce a (K+2)-byte word. The K bytes may form part of a larger information stream, and may, for example, include bytes n through n+K of the larger information stream. 2-byte Fletcher checksum includes a C0-byte 504 (the first checksum value described above), and a C1-byte 506 (the second checksum value described above). The C0-byte 502 is determined by determining a modulo sum of the K bytes of the codeword. In the illustrated example, an initial C0-byte 507 (set to zero or another known value) is combined at 510 with the first byte. The result is combined at 512 with the second byte, and so on until the result is combined at 514 with the Kth byte to produce the finished value for the C0-byte.

The C1-byte 502 is determined by determining a modulo sum of the interim results produced in the determination of the C0-byte. In the illustrated example, an initial C0-byte 215 (set to zero or another known value) is combined at 516 with the first interim result (i.e. the output of 510). The result is combined at 518 with the second interim result (i.e. the output of 512), and so on until the result is combined at 520 with final result (i.e. the output of 514) to produce the finished value for the C1-byte.

In some embodiments, some or all of the information bits and the Fletcher checksum bits are inserted in to an input vector for polar encoding in positions corresponding with relatively reliable bit positions for the polar code. What constitutes relatively reliable can be defined on an implementation specific basis, for example in terms of a reliability criterion. For example, a P×u bit checksum may be inserted in the P×u most reliable bit positions across the entire input vector. In another example, a P×u bit checksum may be inserted in the bit positions that are within the top W % of all reliabilities, where W is a defined threshold, for example 10%. In some embodiments, the Fletcher checksum bits are inserted following the information bits in most reliable bit positions within a latter portion of the input vector. For example, a 16 bit checksum maybe inserted in the 16 most reliable bit positions in the last quarter of the input vector. More generally, the Fletcher checksum bits do not need to all be together or at the end, so long as the transmitter and receiver know the positions of the Fletcher checksum bits and the information bits. Frozen bits (more generally bits known to both the transmitter and the receiver) may be inserted in relatively unreliable bit positions for the polar code. More generally, the described Fletcher checksum approach can be used to process a set of K information blocks to produce a Fletcher checksum with u blocks, where K>=2, and u>=1, and where each information block or checksum block contains P bits, where P>=2. The blocksize P is 8 in the specific examples described, but other values can be used.

Next, an N-bit input vector is produced with P×K information bits and the P×u Fletcher checksum bits in Polar code reliable bit positions, and with N−(P×K)−(P×u) frozen bits in Polar code reliable bit positions, where $N=2^m$ where m>=2. The vector is then encoded with a Polar code encoder, for example by multiplying the vector by an m-fold Kronecker product matrix of previously described $G_2$.

Figure 6:
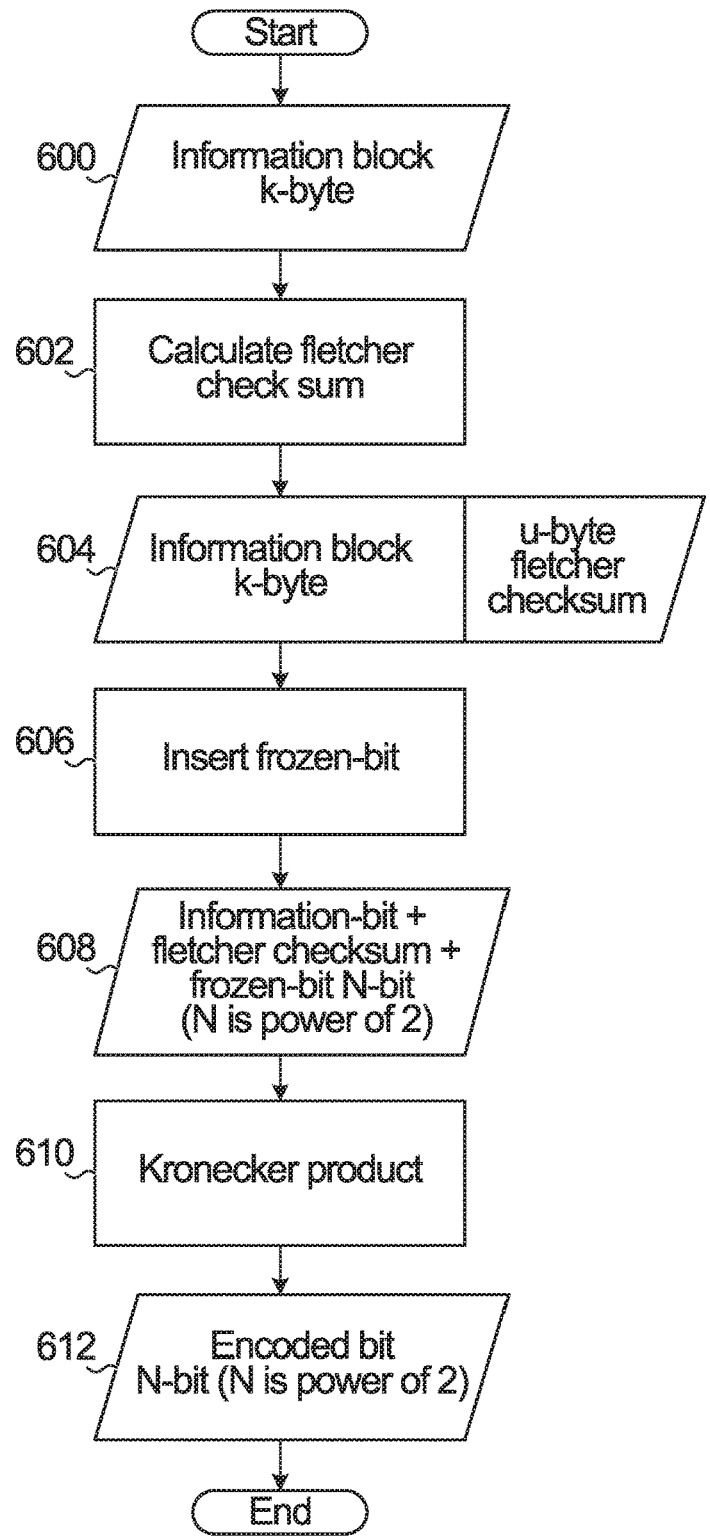
FIG. 6 is a flow chart of the method performing Polar encoding based on information bits and a Fletcher Checksum.

An example encoding method will now be described with reference to FIG. 6. Starting with a K-byte information word 600, a u-byte Fletcher checksum is computed. The bits of the Fletcher checksum are inserted at 602 to produce a vector 604 that includes the bits of the K information bytes and the bits of the Fletcher checksum. At 606, the N−8K−8u frozen bits are inserted to produce the N-bit input vector with the K-bytes of information and the u-bytes of Fletcher checksum, where N is $2^m$. The vector 608 is then multiplied by the m-fold Kronecker product matrix at 610 to produce an N-bit codeword 612.

In an example implementation, the input vector has K=64 bytes, there are 256 information bits, 16 bits containing a 2-byte Fletcher checksum, and 240 frozen bits for a code rate of 0.5.

A polar decoder for decoding a Polar code with Fletcher checksum does not require significant extra complexity compared with a conventional Polar decoder. The decoder decodes treats the checksum bits as unknown information bits, and decodes the information bits and the Fletcher checksum bits, using the known values for the frozen bits in the same way as in conventional Polar decoders. Upon completion, the Fletcher checksum is computed at the receiver and compared to the decoded value for the checksum. If there is a match, there is a high probability that the information bits have been decoded correctly. If there is a match, the decoder may conclude the decoded information bits are correct, and output these bits for further processing in the remainder of the system.

Figure 7A:
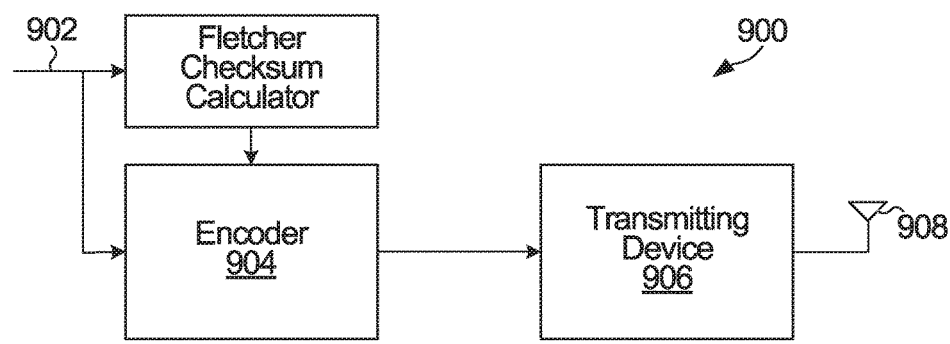
FIG. 7A is a block diagram of an apparatus that performs Polar encoding with a Fletcher Checksum.

Typically the encoder described herein is included as part of an apparatus that includes other components. These might, for example, include a modulator that modulates bits output by the encoder to produce symbols, and a transmitter that transmits the symbols over a channel such as a wireless channel. Similar reverse functionality would be in the receiver together with the decoder. Turning now to example apparatuses for implementing the methods described above, FIG. 7A is a schematic illustration of an apparatus 900 for encoding and transmitting a codeword. Apparatus 900 comprises a Fletcher checksum calculator 903, and a Polar encoder 904 coupled to a transmitting device 906. In the illustrated embodiment, the transmitting device 906 has an antenna 908 for transmitting signals over a wireless channel. In some embodiments, the transmitting device 906 includes a modulator, amplifier, and/or other components of a radio frequency (RF) transmit chain. The Polar encoder 904 receives input 902 comprising information bits and also receives the checksum computed by the Fletcher checksum calculator 903, and is configured to implement a method described above to encode the information bits into a codeword, which is provided to the transmitting device 906 for transmission via the antenna 908.

Figure 7B:
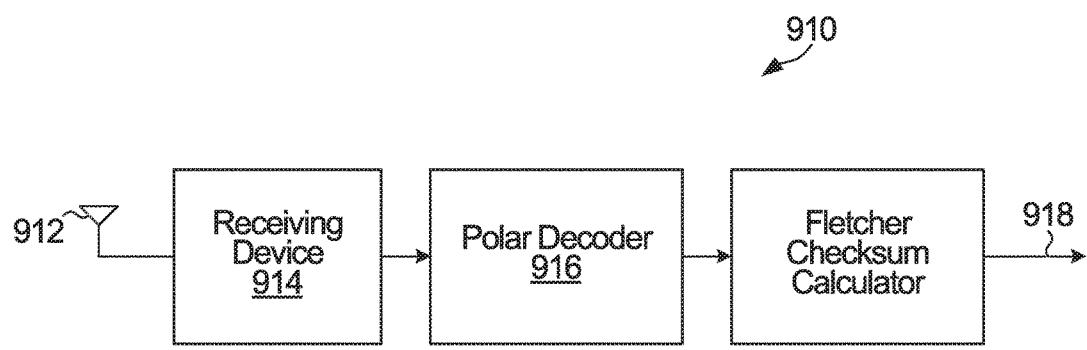
FIG. 7B is a block diagram of an apparatus that performs Polar decoding with a Fletcher Checksum

FIG. 7B is a schematic illustration of an apparatus 910 for receiving and decoding a received word. Apparatus 910 comprises a receiving device 914 coupled to a Polar decoder 916 that is in turn coupled to Fletcher checksum calculator 917. In the illustrated embodiment, the receiving device 914 has an antenna 912 for receiving signals from a wireless channel. In some embodiments, the receiving device 914 includes a demodulator, amplifier, and/or other components of a radio frequency (RF) receive chain. The receiving device 914 receives a signal carrying a received word based on a codeword via the antenna 912. The received word is provided to the decoder 916. The Polar decoder 916 and Fletcher checksum calculator 917 are configured to implement a method described above to decode the received word into an output vector consisting of information bits, which is provided as output 918.

In some embodiments, a non-transitory computer readable medium comprising instructions for execution by a processor may be provided to control the operation of encoder 904 in FIG. 8A or decoder 916 in FIG. 8B, and/or to otherwise control the execution of methods described above. In some embodiments, the processor being controlled may be a component of a general-purpose computer hardware platform. In other embodiments, the processor may be a component of a special-purpose hardware platform. For example, the processor may be an embedded processor, and the instructions may be provided as firmware. Some embodiments may be implemented by using hardware only. In some embodiments, the instructions for execution by a processor may be embodied in the form of a software product. The software product may be stored in a non-volatile or non-transitory storage medium, which can be, for example, a compact disc read-only memory (CD-ROM), universal serial bus (USB) flash disk, or a removable hard disk.

A specific example of a Polar code has been described in which the code is based on the m-fold Kronecker product of a specific $G_2$. The result is polarization, as described, in which some bit positions are reliable and others are unreliable. In some embodiments, such a specific Polar code is employed, with the Fletcher checksum as described. More generally the Fletcher checksum can be used in combination with any encoder that results in polarization between a set of reliable bit positions and a set of unreliable bit positions. Any generator matrix that produces this effect will be referred to herein as a Polar code generator matrix.

The embodiments described above employ the use of a Fletcher checksum. A Fletcher checksum is a specific example of a blockwise checksum, that performs a checksum on blocks of bits for example. That is to say a byte (or even more bits together)—operation is applied on the data to be protected. Examples of Fletcher checksums include Fletcher-16, Fletcher-32 and Fletcher-64, but there are others. More generally, any blockwise checksum can be employed in place of the Fletcher checksum in the embodiments described herein. Another example of a blockwise checksum is an Adler Checksum. This is to be contrasted with a bit-level checker such as a CRC, where a bit-level polynomial is applied on the data-bit to be protected.

More generally, any method of encoding or decoding that is mathematically equivalent with the described methods can be employed. For example, once a set of codewords is determined as described herein, many different encoder structures known in the art can be used to encode input data to produce codewords.

The previous description of some embodiments is provided to enable any person skilled in the art to make or use an apparatus, method, or processor readable medium according to the present disclosure. Various modifications to these embodiments will be readily apparent to those skilled in the art, and the generic principles of the methods and devices described herein may be applied to other embodiments. Thus, the present disclosure is not intended to be limited to the embodiments shown herein but is to be accorded the widest scope consistent with the principles and novel features disclosed herein.

The invention claimed is:

1. A method comprising:
   with a blockwise checksum calculator, processing a set of K information blocks to produce a blockwise checksum with u blocks, where K>=2, and u>=1, and where each information block or checksum block contains P bits, where P>=2;
   producing an N-bit input vector with P×K information bits and the P×u blockwise checksum bits, and with (N−P×K−P×u) frozen bits, where $N=2^m$ where m>=2;
   with a polar encoder, processing the N-bit input vector to produce a result equivalent to multiplying the input vector by a Polar code generator matrix to produce a codeword;
   transmitting the codeword over a physical channel, the polar encoding being performed to improve a reliability of transmission of the input bits over the physical channel.

2. The method of claim 1 wherein the blockwise checksum is a Fletcher checksum.

3. The method of claim 2 wherein u=2 and P=8.

4. The method of claim 3 wherein computing the Fletcher checksum comprises:
   computing a first checksum value by determining a modular sum of all the P=8-bit bytes of the set of information blocks;

computing a second checksum value by determining a modular sum of interim values produced while calculating the first checksum value as each byte is added;

combining the first checksum value and the second checksum value to form the Fletcher checksum value.

5. The method of claim 4 wherein combining first checksum value and the second checksum value to form the Fletcher checksum value comprises concatenating the first checksum value and the second checksum value.

6. The method of claim 5 wherein combining first checksum value and the second checksum value to form the Fletcher checksum value comprises determining a modular sum of the first checksum value and the second checksum value.

7. The method of claim 1 wherein the generator matrix is an m-fold Kronecker product matrix $G_2^{\otimes m}$, where $$G_2 = \begin{bmatrix} 1 & 0 \\ 1 & 1 \end{bmatrix}.$$

8. The method of claim 1 wherein the blockwise checksum bits are inserted in relatively reliable positions for the Polar code generator matrix, as determined by a reliability criterion.

9. The method of claim 1 wherein the blockwise checksum bits are inserted in positions within the top W % in terms of reliability, where W is a defined threshold.

10. The method of claim 9 wherein W %=10%.

11. An apparatus comprising:
a blockwise checksum calculator to process a set of K information blocks to produce a blockwise checksum with u blocks, where K>=2, and u>=1, and where each information block or checksum block contains P bits;
a polar encoder to produce an N-bit input vector with P×K information bits and the P=u blockwise checksum bits, and with N−(P×K)−(P×u) frozen bits, where N=$2^m$ where m>=2, and to processing the N-bit input vector to produce a result equivalent to multiplying the input vector by a Polar code generator matrix to produce a codeword;

a transmitting device to transmit the codeword over a physical channel, the polar encoding being performed to improve a reliability of transmission of the input bits over the physical channel.

12. The apparatus of claim 11 wherein the blockwise checksum is a Fletcher checksum.

13. The apparatus of claim 12 wherein u=2 and P=8.

14. The apparatus of claim 13 wherein the blockwise checksum calculator computes the Fletcher checksum by:
computing a first checksum value by determining a modular sum of all the P=8-bit bytes of the set of information blocks;
computing a second checksum value by determining a modular sum of interim values produced while calculating the first checksum value as each byte is added;
combining the first checksum value and the second checksum value to form the Fletcher checksum value.

15. The apparatus of claim 14 wherein the blockwise checksum calculator combines the first checksum value and the second checksum value to form the Fletcher checksum value by concatenating the first checksum value and the second checksum value.

16. The method of claim 14 wherein the blockwise checksum calculator combines the first checksum value and the second checksum value to form the Fletcher checksum value by determining a modular sum of the first checksum value and the second checksum value.

17. The apparatus of claim 11 wherein the generator matrix is an m-fold Kronecker product matrix $G_2^{\otimes m}$, where $$G_2 = \begin{bmatrix} 1 & 0 \\ 1 & 1 \end{bmatrix}.$$

18. The apparatus of claim 11 wherein the blockwise checksum bits are inserted in relatively reliable positions for the Polar code generator matrix as determined by a reliability criterion.

19. The apparatus of claim 11 wherein the blockwise checksum bits are inserted in positions within the top W % in terms of reliability, where W is a defined threshold.

20. The apparatus of claim 19 wherein W %=10%.

* * * * *